United States Patent
Chu et al.

(10) Patent No.: US 6,346,366 B1
(45) Date of Patent: Feb. 12, 2002

(54) METHOD FOR MAKING AN ADVANCED GUARD RING FOR STACKED FILM USING A NOVEL MASK DESIGN

(75) Inventors: Tsu-Yu Chu, Tau-Yang; Yi-Tung Yen; Chai-Der Chang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 46 days.

(21) Appl. No.: 09/596,906

(22) Filed: Jun. 19, 2000

(51) Int. Cl.7 ............................................. G03C 5/00
(52) U.S. Cl. ................... 430/312; 430/313; 438/218; 438/221; 257/409
(58) Field of Search .................. 430/312, 316; 438/218, 221; 257/409

(56) References Cited

U.S. PATENT DOCUMENTS

| | | | |
|---|---|---|---|
| 5,567,643 A | 10/1996 | Lee et al. | 437/60 |
| 5,881,870 A | 12/1998 | Alugbin et al. | 438/239 |
| 5,926,697 A | 7/1999 | Yaung et al. | 438/132 |

*Primary Examiner*—Rosemary Ashton
(74) *Attorney, Agent, or Firm*—George O. Saile; Stephen B. Ackerman

(57) ABSTRACT

A method for making advanced guard rings in a stacked film on logic/merged DRAM circuits using a novel mask design is achieved. After forming a patterned amorphous silicon (a-Si) layer that has blanket portions over the logic region, a stacked film is deposited over the a-Si layer and extending over the edge and on the memory region. A first photoresist etch mask is used to pattern FET gate electrodes in the stacked film, and the etch mask includes a portion having a minimum width W over the edge of the a-Si layer to form a wide guard ring. This wide guard ring replaces a narrow guard ring that inadvertently forms during conventional processing and that is susceptible to peeling and particle contamination of the wafer. A second photoresist etch mask is used to pattern the a-Si layer to form FET gate electrodes over the logic region. The remaining process steps commonly practiced in the industry are carried out to complete the logic/merged DRAM circuit without the peeling and contamination that results from a narrow guard ring.

18 Claims, 4 Drawing Sheets

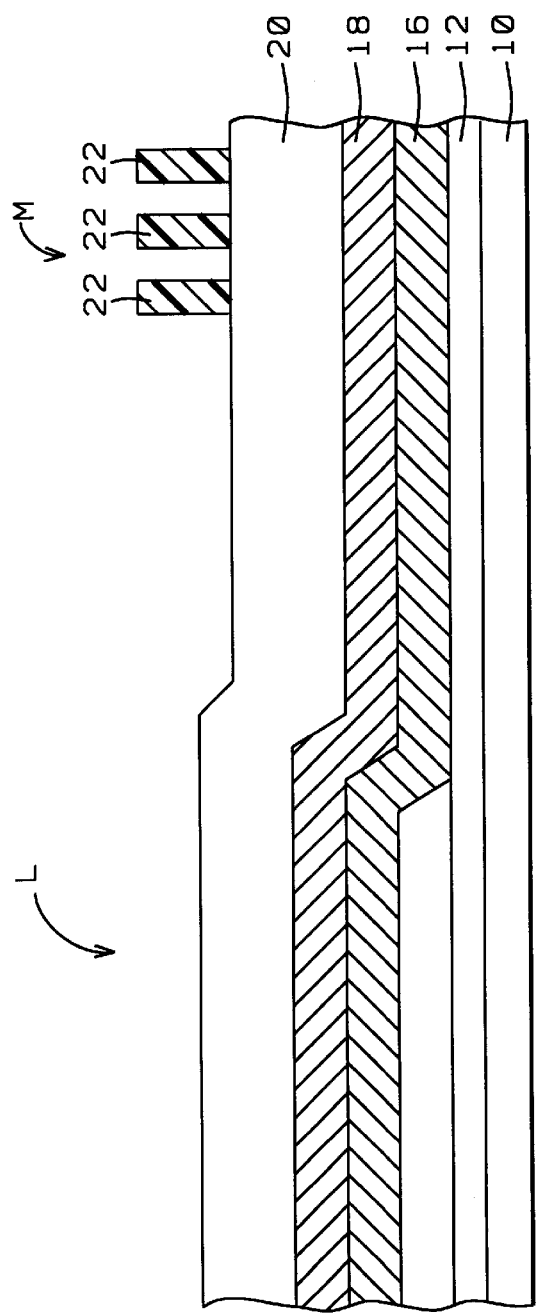
FIG. 1 – Prior Art
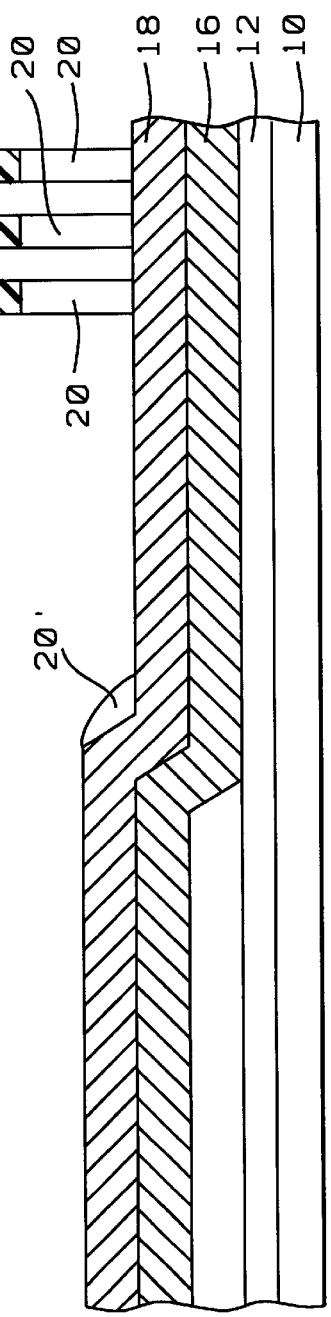
FIG. 2 – Prior Art

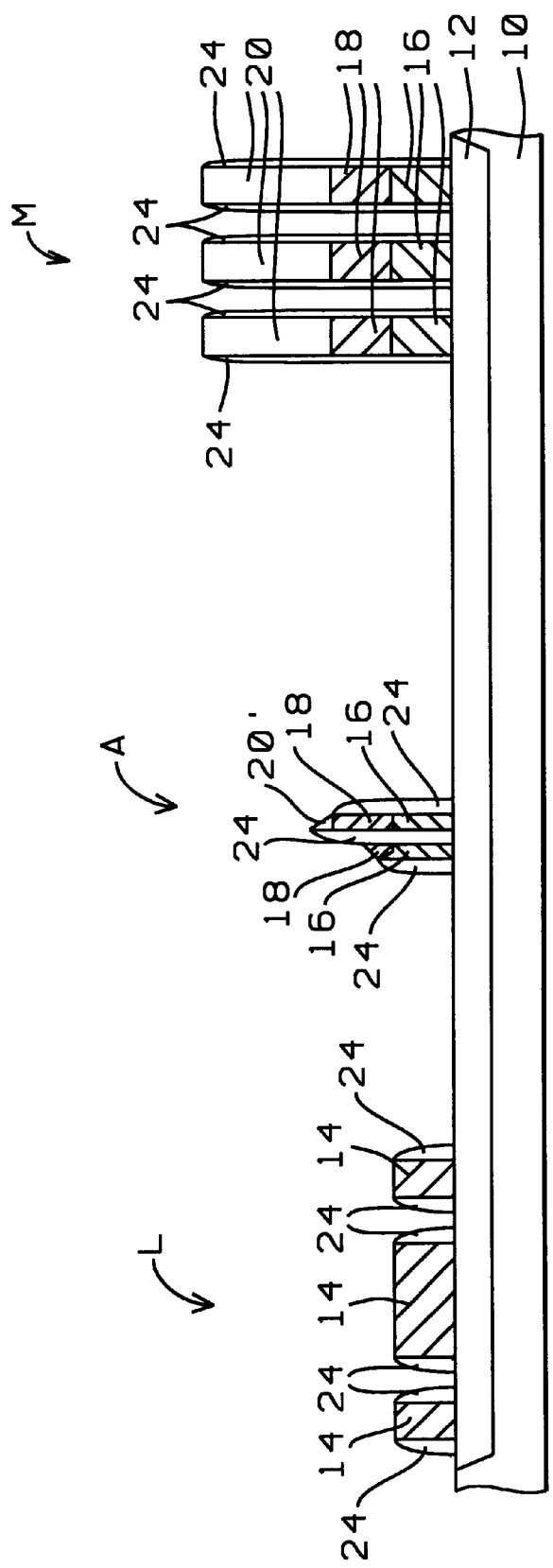
FIG. 3 – Prior Art

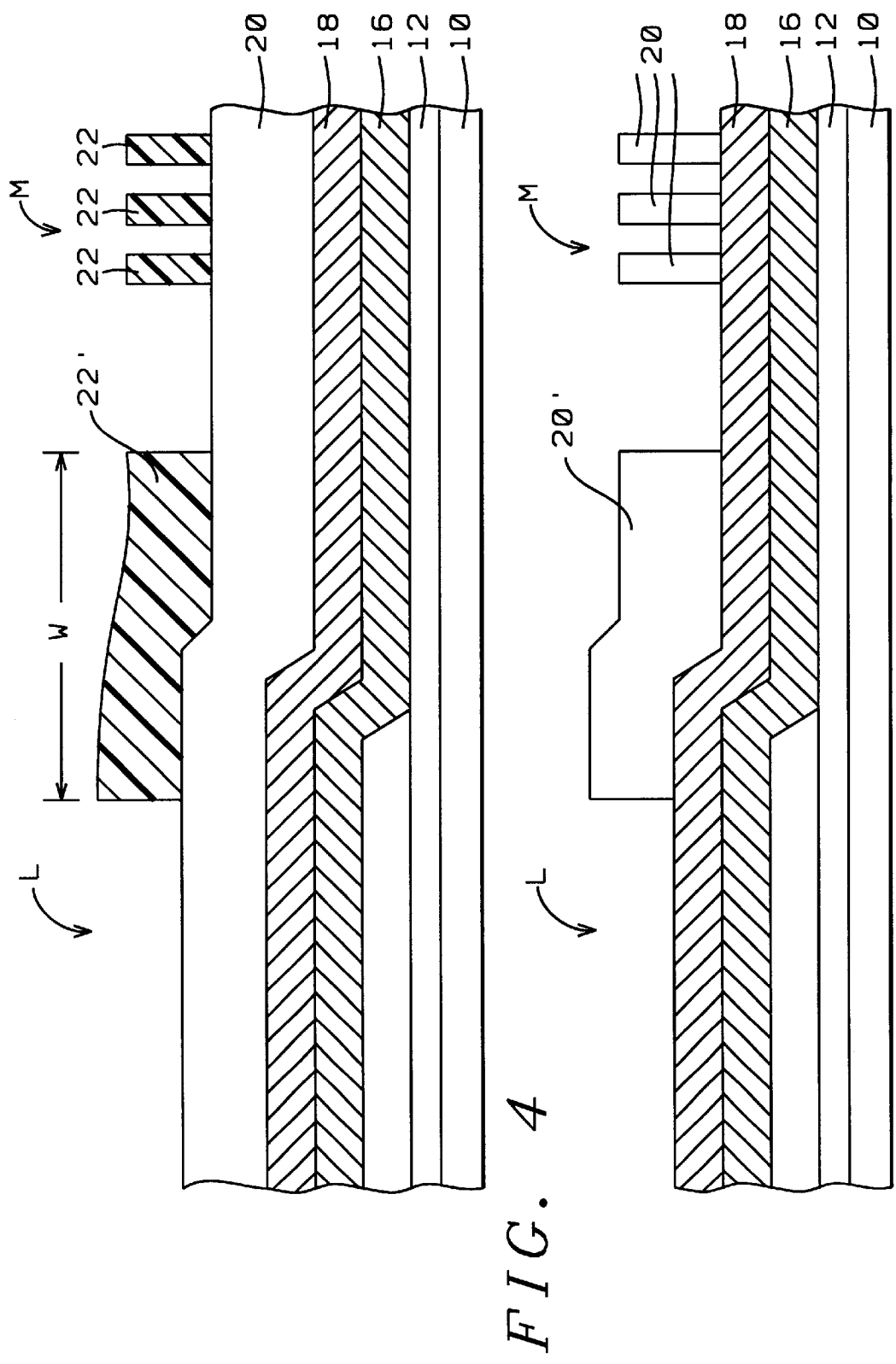

METHOD FOR MAKING AN ADVANCED GUARD RING FOR STACKED FILM USING A NOVEL MASK DESIGN

BACKGROUND OF THE INVENTION

(1) Field of the Invention

The present invention relates to a method for fabricating integrated circuits. More particularly, the method utilizes a novel mask design to form wider guard-band rings around the logic regions on merged DRAM circuits. This novel design prevents the formation of unwanted (superfluous) narrower guard rings that are inadvertently formed in stacked films over steps in the underlying substrate. These unwanted narrow guard rings are formed when anisotropic plasma etching is used for etching high-aspect-ratio patterns on the substrate using the conventional processes. The narrow guard rings tend to peel during subsequent processing, which causes defects. In this novel design wider guard rings are intentionally formed to prevent the peeling that would otherwise occur with the narrower guard rings.

(2) Description of the Prior Art

The integrated circuit density on ultra-large-scale integrated (ULSI) circuits has dramatically increased due to advances in semiconductor processing, such as the use of high-resolution photolithography and anisotropic plasma etching, to achieve very narrow (submicrometer images) device structures having high aspect ratios. Also the deposition of a conformal layer and anisotropic plasma etching are used in current processing to make sidewall spacers for self-aligning structures, such as the sidewall spacers on FET gate electrodes. However, in many cases the anisotropic plasma etching can result in unwanted structures on the substrate that are detrimental to the semiconductor process.

The problem associated with the narrow guard rings is best understood with reference to FIGS. 1–3 for the conventional logic/merged DRAM circuits processing. In FIG. 1 a schematic cross-sectional view is depicted for a portion of a substrate that has a logic region having FETs on the left side of the drawing, labeled L, and a memory region having DRAM cells on the right side, labeled M. The process sequence in this conventional process starts by forming shallow trench isolation 12 in a single-crystal-silicon substrate 10. Next an amorphous silicon layer 14 is deposited and patterned by masking and etching to leave a blanket portion over the logic region. A stacked polycide film (layer) 16, 18, and 20 is deposited and patterned to form the FET gate electrodes and word lines for the DRAM devices in the memory region M. The stacked layer consists of a conductively doped polysilicon layer 16, a silicide layer 18, and an upper insulating layer 20, such as silicon nitride, having an approximate stoichiometric composition of $Si_3N_4$. The stacked film (layers 16, 18, and 20) is then patterned using a photoresist etch mask 22 and anisotropic plasma etching to minimize the bias etching (lateral etching) to achieve high-resolution images in the stacked film. Unfortunately, as shown in FIG. 2, the directional etching results in unintentional sidewall spacers (or residue) 20' in the $Si_3N_4$ layer 20 that then acts as a masking material when the etching is continued to pattern the remaining silicide layer 18 and the doped polysilicon layer 16, as shown in FIG. 3. Also as shown in FIG. 3, a second photoresist mask (not shown) and anisotropic etching are then used to pattern the portion of the amorphous silicon layer 14 over the logic regions to form the FET gate electrodes, also labeled 14, and to form local inter-connections. Next sidewall spacers 24 are formed on the logic FET gate electrodes 14 and the memory FET gate electrodes (layers 16, 18, and 20). The sidewall spacers 24 also form on the narrow guard ring A composed of the narrow strips of layers 16, 18, and 20', also depicted in FIG. 3. These thin multilayers in the narrow guard ring result in high stress and, during subsequent processing, can result in various degrees of peeling that form particle defects and reduce the product yield.

Several methods of making guard rings around device areas to prevent contamination have been reported in the literature. For example, U.S. Pat. No. 5,926,697 to Yaung et al. shows a method for making a guard ring to prevent diffusion of moisture and contaminants from a window in an insulating layer to the semiconductor device regions. U.S. Pat. No. 5,567,643 to Lee et al. also shows a method for forming guard rings (annular metal rings) to prevent contamination from diffusing through window openings in several insulating layers. U.S. Pat. No. 5,851,870 to Alugbin et al. shows a method for making a capacitor in which contacts to the capacitor bottom electrode also form guard rings.

The narrow unwanted guard rings depicted in the prior art FIGS. 1–3 are generally a problem for making reliable integrated circuits with good yield. There is still a need in the semiconductor industry to provide an improved process for making logic/merged DRAM circuits without these narrow unwanted guard rings or to modify the guard ring to minimize the peeling problem, while providing a cost-effective manufacturing process.

SUMMARY OF THE INVENTION

It is therefore a principal object of this invention to provide a wide guard ring that extends over a step formed in the underlying substrate at the perimeter of logic regions on merged logic/DRAM circuits which prevents peeling of the narrow guard ring inadvertently formed using the more conventional processing.

Another object of this invention is to achieve the above objective by modifying the design of a photoresist etch mask for etching the salicide FET gate electrodes in a stacked film. The modified etch mask includes portions of the photoresist over the step in the underlying substrate. The photoresist portion is then used to etch wider guard rings in the stacked film over the step, which is less susceptible to peeling.

Still another object of this invention is to form the guard rings at the same time that the salicide FET gate electrodes are formed to minimize the number of photoresist masks, and therefore provide a cost-effective manufacturing process.

The method for making a wide guard ring on a merged logic/DRAM integrated circuit is achieved. This wide guard ring replaces a narrow guard ring that is unintentionally formed on the perimeter of the logic regions using the conventional process. The narrow guard ring is susceptible to peeling due to stress. This peeling results in particles on the substrate that cause defects during subsequent processing and reduces product yield.

The method for making this wider guard ring structure begins by providing a semiconductor substrate having logic regions and memory regions, both having device areas. Typically the substrate is a single-crystal silicon in which the device areas are surrounded and electrically isolated from each other by field oxide areas. For advanced high-density circuits the field oxide of choice is a shallow trench isolation consisting of a trench in the substrate that is filled with an insulating material and then polished back to form a field oxide that is planar with the substrate surface. Next a gate oxide is formed on the device areas. An amorphous silicon layer is deposited on the substrate and patterned to leave a blanket portion over the logic regions while removing portions of the amorphous layer over the memory regions. Typically the amorphous film has an etch-stop layer, such as silicon oxide and/or silicon nitride, on its top surface. Next a blanket stacked film is deposited on the substrate. Preferably the stacked film is formed by depositing consecutively a blanket polysilicon layer, a tungsten silicide layer, and a silicon nitride layer. The stacked film is then patterned using a first photoresist etch mask for etching FET gate electrodes over the memory regions. A key feature of this invention is that the photoresist mask is also designed to include a band of photoresist that extends over the edge of the amorphous silicon layer for etching wider guard rings. The photo-resist mask and anisotropic etching are used to pattern the stacked film for the FET gate electrodes in the memory region and to concurrently form the wider guard rings in the stacked film over the edge of the amorphous silicon layer. Since this novel guard ring is sufficiently wider than the unintentional guard ring that results in the prior art, the peeling is prevented. A second photoresist etch mask and plasma etching are used to form gate electrodes in the amorphous silicon layer over the logic regions. Next a conformal insulating layer is deposited and is anisotropically plasma etched back to form sidewall spacers on the FET gate electrodes formed in both the amorphous silicon and in the stacked film. Concurrently the sidewall spacers are formed on the wider guard rings. After forming these novel guard ring structures, conventional processing can be used to complete the FETs and memory devices including capacitors. Next the multilevels of electrical interconnections are made to complete the logic/merged DRAM circuits.

BRIEF DESCRIPTION OF THE DRAWINGS

The objects and other advantages of this invention are best understood with reference to the preferred embodiment when read in conjunction with the following drawings.

FIGS. 1–3 are schematic cross-sectional views through a portion of a logic/merged DRAM circuit depicting the problem of a peeling narrow guard ring of the prior art.

FIGS. 4–7 are schematic cross-sectional views through a portion of a logic/merged DRAM circuit, by the method of this invention, depicting the formation of a wider guard ring that eliminates the problem of a peeling narrow guard ring of the prior art.

DESCRIPTION OF THE PREFERRED EMBODIMENT

Figure 6:
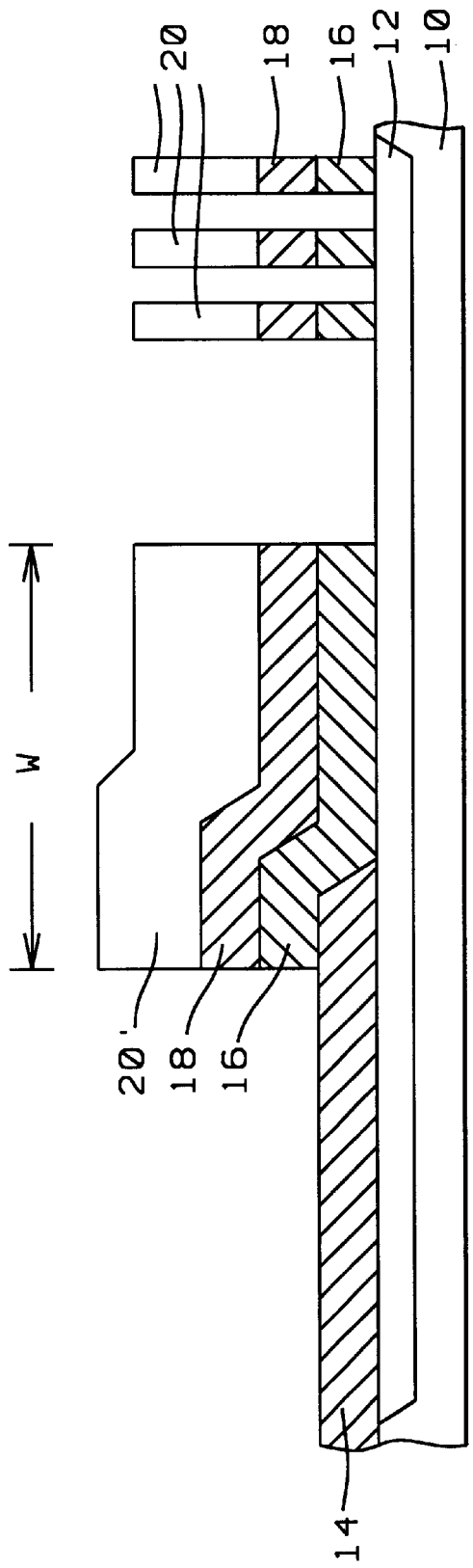

The present invention relates to a method for making wide guard ring structures. The process for making this structure is incorporated into the process for making logic/merged DRAM circuits without increasing the process complexity. The method utilizes a novel photoresist etch mask design that includes a portion that extends over steps in the underlying substrate. Stacked layers now patterned have wider guard rings that are less likely to peel than the unwanted narrow guard rings that would otherwise be formed inadvertently during the conventional processing, as shown in FIG. 3 of the prior art. Although the method is applicable to logic/merged DRAM circuits, it should be understood by those skilled in the art that the method can be applied to other integrated circuit groups.

Referring now to FIG. 4, the method for making these wider guard ring structures on logic/merged DRAM circuits begins by providing a semiconductor substrate 10, a portion of which is shown in the schematic cross-sectional view of FIG. 4. A logic region L is depicted in the left portion of the figure, and a memory region M is depicted in the right portion. Both the L and N regions have device areas in and on which the FETs are formed. Typically the substrate is a P– doped single-crystal silicon having a <100> crystallographic orientation. The device areas are surrounded and electrically isolated from each other by field oxide areas 12. For advanced high-density circuits the preferred field oxide 12 is a Shallow Trench Isolation (STI), as is commonly practiced in the semiconductor industry. Briefly, the STI is formed by etching trenches in the field oxide areas on the substrate to a depth of between about 3500 and 4000 Angstroms. The STI is typically formed by depositing silicon oxide and is made planar with the surface of the substrate 10 by using a planarizing etch-back technique or by chemical-mechanical polishing (CMP). The FET gate oxide (not shown) is formed on the device areas. To simplify the drawings, FIGS. 4–7 are for a cross section through the STI 12, and do not include the device areas. Therefore the gate oxide and the source/drain areas for the FETs are not explicitly depicted in the Figs.

Still referring to FIG. 4, an amorphous silicon (a-Si) layer 14 is deposited on the substrate 10 and over the field oxide 12. Layer 14 is preferably deposited by low-pressure chemical vapor deposition (LPCVD) using silane ($SiH_4$) as the reactant gas and is deposited at a relatively low temperature of between about 545 and 550° C. The a-Si layer 14 is deposited to a preferred thickness of between about 1900 and 2000 Angstroms. The a-Si layer 14 also includes an etch-stop layer, such as a CVD $SiO_2$ or a $Si_3N_4$ layer, on the top surface, but is not shown to simplify the drawings. The a-silicon layer 14 is then patterned to leave a blanket portion 14 over the logic regions L while completely removing portions of the amorphous layer over the memory regions M. By virtue of the processing a step is formed on the substrate at the edge of the patterned asilicon layer 14.

Continuing with FIG. 4, a blanket stacked film is deposited on the substrate. Preferably the stacked film is formed by depositing consecutively a blanket polysilicon layer 16, a silicide layer 18, and a silicon nitride hard-mask layer 20. The polysilicon layer is deposited by LPCVD using $SiH_4$ or $SiCl_2H_2$, and is deposited to a thickness of between about 900 and 1100 Angstroms. The silicide layer 18 is preferably tungsten silicide ($WSi_2$) and is deposited by CVD using tungsten hexafluoride ($WF_6$) and $SiH_4$ as the reactant gases, and is deposited to a thickness of between about 900 and 1100 Angstroms. The $Si_3N_4$ hard-mask layer 20 is deposited using LPCVD and a reactant gas mixture, such as $SiH_4$ and ammonia ($NH_3$). Layer 20 is deposited to a preferred thickness of between about 1900 and 2000 Angstroms. The stacked film (16, 18, 20) is then patterned using a first photoresist etch mask 22 for etching FET gate electrodes over the memory region.

A key feature of this invention is that the photoresist mask 22 is also designed to include a photoresist portion 22' that extends over the edge of the amorphous silicon layer 14 for etching a wider guard ring. The portion 22' of the first photoresist mask is designed to have a width W which is at least greater than 8500 Angstroms.

Referring to FIG. 5, the photoresist mask 22, which includes the guard ring portion 22', is used as an etch mask. Then an anisotropic etch is used to define the images for the FET gate electrodes in the hard-mask layer 20 in the memory region M. Concurrently the hard-mask layer 20 is etched to include the hard mask 20' for the guard ring. Preferably the anisotropic plasma etching is carried out in a reactive ion etcher (RIE) using an etchant gas mixture such as $CHF_3$, $CF_4$, $O_2$, and a carrier gas of Ar. The first photoresist mask (22, 22') is then removed by plasma ashing in oxygen ($O_2$) and/or by wet stripping.

Referring to FIG. 6, the patterned hard mask 20 and another anisotropic plasma etching are used to pattern the remaining layers of the stacked film (18 and 16) to form the FET gate electrodes in the memory region M and to concurrently form the wider guard ring G in the stacked film over the edge of the amorphous silicon layer 14. The second anisotropic plasma etching is carried out in a RIE using an etchant gas mixture that etches polysilicon selectively to the field oxide 12 and to the gate oxide (not shown), and also to the etch-stop layer (not shown) on the a-Si layer 14. For example, an etchant gas mixture containing a chlorine species can be used for this selective etching. Since this novel guard ring G is sufficiently wider than the unintentional guard ring A that results in the prior art (FIG. 3), this wider guard ring G prevents peeling.

Figure 7:
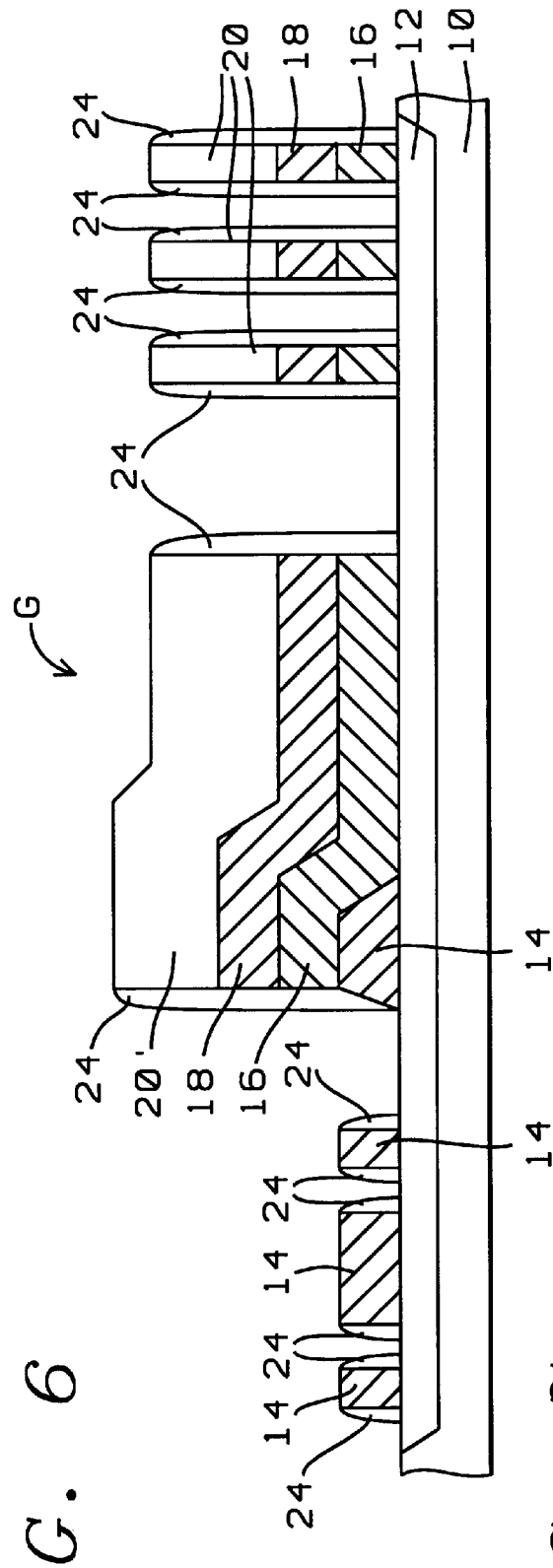

Referring to FIG. 7, a second photoresist etch mask (not shown) and anisotropic plasma etching are used to form gate electrodes in the amorphous silicon layer 14 over the logic region L. The etching can be carried out in a RIE using a chlorine-containing etchant gas mixture. A conformal insulating layer is deposited. The insulating layer is a $SiO_2$ or a multilayer of $SiO_2$ and $Si_3N_4$, which is deposited by LPCVD to a thickness of between about 900 and 1100 Angstroms. The insulating layer is then anisotropically plasma etched back to form sidewall spacers 24 on the amorphous silicon FET gate electrodes 14 in the logic region L, and on the FET gate electrodes formed from the stacked film (layers 16, 18, and 20) in the memory region M. The sidewall spacers are also formed on the wider guard ring G. After forming this novel guard ring structure G, conventional processing can be used to complete the FETs and memory devices, including the DRAM capacitors, and a multilevel of metal interconnections is formed to complete the logic/merged DRAM circuits.

While the invention has been particularly shown and described with reference to the preferred embodiment thereof, it will be understood by those skilled in the art that various changes in form and detail may be made without departing from the spirit and scope of the invention.

What is claimed is:

1. A method for making a guard ring on a merged DRAM integrated circuit comprising the steps of:

providing a semiconductor substrate having logic regions and memory regions having device areas, said device areas surrounded and electrically isolated from each other by field oxide areas that includes a gate oxide on said device areas;

depositing an amorphous silicon layer on said substrate;

patterning said amorphous silicon layer to leave a blanket portion over said logic regions and removing portions over said memory regions;

depositing a stacked film on said substrate;

forming a first photoresist etch mask for etching FET gate electrodes in said stacked film over said memory regions, and concurrently forming portions of said first photoresist mask extending over edges of said amorphous silicon layer for etching guard rings;

plasma etching to form said FET gate electrodes and concurrently forming said guard rings in said stacked film over said edges, whereby said guard rings are sufficiently wide to prevent peeling of said guard rings;

forming a second photoresist etch mask and plasma etching to form gate electrodes in said amorphous silicon layer over said logic regions;

depositing a conformal insulating layer and etching back to form sidewall spacers on said FET gate electrodes formed in said amorphous silicon and in said stacked film, and to concurrently form sidewall spacers on said guard rings.

2. The method of claim 1, wherein said amorphous silicon layer is deposited by low-temperature chemical vapor deposition to a thickness of between about 1900 and 2000 Angstroms.

3. The method of claim 1, wherein said amorphous silicon layer includes an etch-stop layer on its top surface.

4. The method of claim 1, wherein said stacked film is formed by depositing consecutively a blanket polysilicon layer to a thickness of between about 900 and 1100 Angstroms, a tungsten silicide layer to a thickness of between about 900 and 1100 Angstroms, and a silicon nitride layer to a thickness of between about 1900 and 2000 Angstroms.

5. The method of claim 1, wherein said guard rings are designed to have a width that is at least greater than 8500 Angstroms.

6. The method of claim 1, wherein said conformal insulating layer for said sidewalls is silicon nitride and is deposited to a thickness of between about 1900 and 2000 Angstroms.

7. A method for making a guard ring on a merged DRAM integrated circuit comprising the steps of:

providing a semiconductor substrate having logic regions and memory regions having device areas, said device areas surrounded and electrically isolated from each other by field oxide areas that includes a gate oxide on said device areas;

depositing an amorphous silicon layer on said substrate;

patterning said amorphous silicon layer to leave a blanket portion over said logic regions and removing portions over said memory regions;

forming a stacked film by sequentially depositing a blanket polysilicon layer, a tungsten silicide layer, and a silicon nitride layer on said substrate;

forming a first photoresist etch mask for etching FET gate electrodes in said stacked film over said memory regions, and concurrently forming portions of said first photoresist mask extending over edges of said amorphous silicon layer for etching guard rings;

plasma etching to form said FET gate electrodes and concurrently forming said guard rings in said stacked film over said edges, whereby said guard rings are sufficiently wide to prevent peeling of said guard rings;

forming a second photoresist etch mask and plasma etching to form gate electrodes in said amorphous silicon layer over said logic regions;

depositing a conformal insulating layer and etching back to form sidewall spacers on said FET gate electrodes formed in said amorphous silicon and in said stacked film, and to concurrently form sidewall spacers on said guard rings.

8. The method of claim 7, wherein said amorphous silicon layer is deposited by low-temperature chemical vapor deposition to a thickness of between about 1900 and 2000 Angstroms.

9. The method of claim 7, wherein said amorphous silicon layer includes an etch-stop layer on its top surface.

10. The method of claim 7, wherein said blanket polysilicon layer of said stacked film is deposited to a thickness of between about 900 and 1100 Angstroms, wherein said tungsten silicide is deposited to a thickness of between about 900 and 1100 Angstroms, and wherein said silicon nitride layer is deposited to a thickness of between about 1900 and 2000 Angstroms.

11. The method of claim 7, wherein said guard rings are designed to have a width that is at least greater than 8500 Angstroms.

12. The method of claim 7, wherein said conformal insulating layer for said sidewalls is silicon nitride and is deposited to a thickness of between about 1900 and 2000 Angstroms.

13. A guard ring on a merged DRAM integrated circuit comprised of:

- a semiconductor substrate having logic regions and memory regions having device areas, said device areas surrounded and electrically isolated from each other by field oxide areas that includes a gate oxide on said device areas;
- an amorphous silicon layer having a pattern that leaves blanket portions over said logic regions;
- a stacked film on said substrate having a pattern that forms FET gate electrodes over and on said memory regions, and also said stacked film having a pattern that forms said guard rings extending over edges of said amorphous silicon layer; and,
- said guard rings having a width that is sufficiently wide to prevent peeling of said guard rings;
- FET gate electrodes formed in said amorphous silicon layer over said logic regions;
- sidewall spacers on said FET gate electrodes formed from said amorphous silicon and from said stacked film, and also on sidewalls of said guard rings.

14. The structure of claim 13, wherein said amorphous silicon layer has a thickness of between about 1900 and 2000 Angstroms.

15. The structure of claim 13, wherein said amorphous silicon layer includes an etch-stop layer on its top surface.

16. The structure of claim 13, wherein said stacked film is formed by depositing consecutively a blanket polysilicon layer to a thickness of between about 900 and 1100 Angstroms, a tungsten silicide layer to a thickness of between about 900 and 1100 Angstroms, and a silicon nitride layer to a thickness of between about 1900 and 2000 Angstroms.

17. The structure of claim 13, wherein said guard rings are designed to have a width that is at least greater than 8500 Angstroms.

18. The structure of claim 13, wherein said conformal insulating layer for said sidewalls is silicon nitride and is deposited to a thickness of between about 1900 and 2000 Angstroms.

* * * * *